United States Patent [19]

Swan et al.

[11] Patent Number: 5,145,598

[45] Date of Patent: * Sep. 8, 1992

[54] AZEOTROPE-LIKE COMPOSITIONS OF 1,1-DICHLORO-1-FLUOROETHANE, DICHLOROTRIFLUORETHANE, NITROMETHANE AND METHANOL OR ETHANOL

[75] Inventors: Ellen L. Swan, Ransomville; Rajat S. Basu, Williamsville, both of N.Y.

[73] Assignee: Allied-Signal Inc., Morristown, N.J.

[*] Notice: The portion of the term of this patent subsequent to Sep. 5, 2006 has been disclaimed.

[21] Appl. No.: 686,272

[22] Filed: Apr. 15, 1991

Related U.S. Application Data

[63] Continuation of Ser. No. 345,732, May 1, 1989, abandoned, which is a continuation-in-part of Ser. No. 297,467, Sep. 17, 1989, Pat. No. 4,894,176, which is a continuation-in-part of Ser. No. 290,124, Dec. 27, 1988, abandoned.

[51] Int. Cl.[5] .......................... C11D 7/30; C11D 7/50; C23G 5/028
[52] U.S. Cl. ..................................... 252/171; 134/12; 134/31; 134/38; 134/39; 134/40; 203/67; 252/153; 252/162; 252/170; 252/364; 252/DIG. 9
[58] Field of Search ............... 252/364, 162, 170, 171, 252/172, DIG. 9, 153; 203/67; 134/12, 38, 39, 40, 31

[56] References Cited

U.S. PATENT DOCUMENTS

| | | | |
|---|---|---|---|
| 3,936,387 | 2/1976 | Reusser | 252/171 |
| 4,035,258 | 7/1977 | Reusser | 252/171 |
| 4,816,174 | 3/1989 | Lund et al. | 252/171 |
| 4,816,175 | 3/1989 | Lund et al. | 252/171 |
| 4,816,176 | 3/1989 | Lund et al. | 252/171 |
| 4,863,630 | 9/1989 | Swan | 252/171 |
| 4,894,176 | 1/1990 | Swan | 252/171 |

FOREIGN PATENT DOCUMENTS

| | | |
|---|---|---|
| 1-103686 | 4/1989 | Japan . |
| 1-136981 | 5/1989 | Japan . |
| 1-136982 | 5/1989 | Japan . |
| 1-138300 | 5/1989 | Japan . |
| 1-139861 | 6/1989 | Japan . |

OTHER PUBLICATIONS

L. Horsley, Azeotropic Data-III, 70 (1973), American Chemical Society-Advances in Chemistry, Series 116.

Primary Examiner—A. Lionel Clingman
Assistant Examiner—Linda D. Skaling
Attorney, Agent, or Firm—Melanie L. Brown; Jay P. Friedenson

[57] ABSTRACT

Azeotrope-like compositions comprising 1,1-dichloro-1-fluoroethane, dichlorotrifluoroethane, nitromethane and ethanol or methanol are stable and have utility as degreasing agents and as solvents in a variety of industrial cleaning applications including cold cleaning and defluxing of printed circuit boards.

20 Claims, No Drawings

AZEOTROPE-LIKE COMPOSITIONS OF 1,1-DICHLORO-1-FLUOROETHANE, DICHLOROTRIFLUORETHANE, NITROMETHANE AND METHANOL OR ETHANOL

This application is a continuation of application Ser. No. 345,732 filed May 1, 1989 now abandoned. Ser. No. 345,732 is a continuation-in-part of patent application Ser. No. 297,467 filed Jan. 17, 1989, which is now U.S. Pat. No. 4,894,176, and is a continuation-in-part application of patent application Ser. No. 290,124 filed Dec. 27, 1988 now abandoned.

DESCRIPTION

1. Field of the Invention

This invention relates to azeotrope-like or essentially constant boiling mixtures of 1,1-dichloro-1-fluoroethane, dichlorotrifluoroethane, nitromethane and methanol or ethanol. These mixtures are useful in a variety of vapor degreasing, cold cleaning and solvent cleaning applications including defluxing.

2. Cross-Reference to Related Applications

Co-pending, commonly assigned application Ser. No. 204,340, filed Jun. 9, 1988, now U.S. Pat. No. 4,836,947 discloses azeotrope-like mixtures of 1,1-dichloro-1-fluoroethane and ethanol.

Co-pending, commonly assigned application Ser. No. 330,252, filed Mar. 29, 1989, now U.S. Pat. No. 4,863,630 discloses azeotrope-like mixtures of 1,1-dichloro-1-fluorethane, dichlorotrifluoroethane and ethanol.

Co-pending, commonly assigned application Ser. No. 189,932 filed May 3, 1988, now U.S. Pat. No. 4,842,764 discloses azeotrope-like mixtures of 1,1-dichloro-1-fluorethane and methanol.

Co-pending, commonly assigned application Ser. No. 297,467, filed Jan. 17, 1989, now U.S. Pat. No. 4,894,176 which is a continuation-in-part of application Ser. No. 290,124, filed Dec. 27, 1988, now abandoned discloses azeotrope-like mixtures of 1,1-dichloro-1-fluoroethane, dichlorotrifluoroethane and methanol.

BACKGROUND OF THE INVENTION

Vapor degreasing and solvent cleaning with fluorocarbon based solvents have found widespread use in industry for the degreasing and otherwise cleaning of solid surfaces, especially intricate parts and difficult to remove soils.

In its simplest form, vapor degreasing or solvent cleaning consists of exposing a room temperature object to be cleaned to the vapors of a boiling solvent. Vapors condensing on the object provide clean distilled solvent to wash away grease or other contamination. Final evaporation of solvent from the object leaves behind no residue as would be the case where the object is simply washed in liquid solvent.

For difficult to remove soils where elevated temperature is necessary to improve the cleaning action of the solvent, or for large volume assembly line operations where the cleaning of metal parts and assemblies must be done efficiently and quickly, the conventional operation of a vapor degreaser consists of immersing the part to be cleaned in a sump of boiling solvent which removes the bulk of the soil, thereafter immersing the part in a sump containing freshly distilled solvent near room temperature, and finally exposing the part to solvent vapors over the boiling sump which condense on the cleaned part. In addition, the part can also be sprayed with distilled solvent before final rinsing.

Vapor degreasers suitable in the above-described operations are well known in the art. For example, Sherliker et al. in U.S. Pat. No. 3,085,918 disclose such suitable vapor degreasers comprising a boiling sump, a clean sump, a water separator, and other ancillary equipment.

Cold cleaning is another application where a number of solvents are used. In most cold cleaning applications, the soiled part is either immersed in the fluid or wiped with rags or similar objects soaked in solvents and allowed to air dry.

Fluorocarbon solvents, such as trichlorotrifluoroethane, have attained widespread use in recent years as effective, nontoxic, and nonflammable agents useful in degreasing applications and other solvent cleaning applications. Trichlorotrifluoroethane has been found to have satisfactory solvent power for greases, oils, waxes and the like. It has therefore found widespread use for cleaning electric motors, compressors, heavy metal parts, delicate precision metal parts, printed circuit boards, gyroscopes, guidance systems, aerospace and missile hardware, aluminum parts and the like.

The art has looked towards azeotropic compositions including the desired fluorocarbon components such as trichlorotrifluoroethane which include components which contribute additionally desired characteristics, such as polar functionality, increased solvency power, and stabilizers. Azeotropic compositions are desired because they do not fractionate upon boiling. This behavior is desirable because in the previously described vapor degreasing equipment with which these solvents are employed, redistilled material is generated for final rinse-cleaning. Thus, the vapor degreasing system acts as a still. Unless the solvent composition exhibits a constant boiling point, i.e., is an azeotrope or is azeotrope-like, fractionation will occur and undesirable solvent distribution may act to upset the cleaning and safety of processing, preferential evaporation of the more volatile components of the solvent mixtures, which would be the case if they were not an azeotrope or azeotrope-like, would result in mixtures with changed compositions which may have less desirable properties, such as lower solvency towards soils, less inertness towards metal, plastic or elastomer components, and increased flammability and toxicity.

The art is continually seeking new fluorocarbon based azeotropic mixtures or azeotrope-like mixtures which offer alternatives for new and special applications for vapor degreasing and other cleaning applications. Currently, of particular interest, are such azeotrope-like mixtures which are based on fluorocarbons which are considered to be stratospherically safe substitutes for presently used fully halogenated chlorofluorocarbons. The latter are suspected of causing environmental problems in connection with the earth's protective ozone layer. Mathematical models have substantiated that hydrochlorofluorocarbons, such as 1,1-dichloro-1-fluoroethane (HCFC-141b) and dichlorotrifluoroethane (HCFC-123 or HCFC-123a), will not adversely affect atmospheric chemistry, being negligible contributors to ozone depletion and to green-house global warming in comparison to the fully halogenated species.

U.S. Pat. No. 3,936,387 discloses the azeotropic composition of methanol with 1,2-dichloro-1-fluoroethane (HCFC-141). U.S. Pat. No. 4,035,258 discloses the azeotropic composition of ethanol with HCFC-141.

L. Horsley, AZEOTROPIC DATA-III, 70 (1973) discloses azeotropic compositions of nitromethane and methanol or ethanol.

U.S. Pat. No. 4,816,174 discloses azeotropic compositions of HCFC-141b, methanol and nitromethane.

U.S. Pat. No. 4,816,176 discloses azeotropic compositions of 2,2-dichloro-1,1,1-trichloroethane (HCFC-123) or 1,2-dichloro-1,1,2-trifluoroethane (HCFC-123a), methanol and nitromethane.

U.S. Pat. No. 4,816,175 discloses azeotropic compositions of HCFC-123 or HCFC-123a, methanol, nitromethane and cyclopentane.

It is an object of this invention to provide novel azeotrope-like compositions based on HCFC-141b and dichlorotrifluoroethane which are liquid at room temperature and which will not fractionate under the process of distillation or evaporation, which are useful as solvents for use in vapor degreasing and other solvent cleaning applications including defluxing applications.

Another object of the invention is to provide novel environmentally acceptable solvents for use in the aforementioned applications.

Other objects and advantages of the invention will become apparent from the following description.

DESCRIPTION OF THE INVENTION

In accordance with the invention, novel azeotrope-like compositions have been discovered comprising HCFC-141b, dichlorotrifluoroethane, nitromethane and methanol or ethanol. The dichlorotrifluoroethane component can be either of its isomers 1,1-dichloro-2,2,2-trifluoroethane (HCFC-123) or 1,2-dichloro-1,2,2-trifluoroethane (HCFC-123a), or mixtures thereof. The preferred isomer is HCFC-123.

Dichlorotrifluoroethane and HCFC-141b do not form binary azeotrope systems.

In one embodiment, the azeotrope-like compositions of the invention comprise from about 62.5 to about 97.9 weight percent of HCFC-141b, from about 2.0 to about 35.5 weight percent of dichlorotrifluoroethane, from about 0.02 to about 0.3 weight percent of nitromethane and from about 0.1 to about 3.0 weight percent ethanol.

In a preferred embodiment of the invention, the azeotrope-like compositions of the invention comprise from about 72.0 to about 94.7 weight percent of HCFC-141b, from about 3.0 to about 26.0 weight percent of dichlorotrifluoroethane, from about 0.05 to about 0.3 weight percent of nitromethane and from about 0.3 to about 2.0 weight percent ethanol.

In a still more preferred embodiment of the invention, the azeotrope-like compositions of the invention comprise from about 75.0 to about 90.0 weight percent of HCFC-141b, from about 5.0 to about 24.7 weight percent of dichlorotrifluoroethane, from about 0.05 to about 0.2 weight percent of nitromethane and from about 0.3 to about 1.8 weight percent ethanol.

In the most preferred embodiment of the invention, the azeotrope-like compositions of the invention comprise from about 77.2 to about 90.0 weight percent of HCFC-141b, from about 5.0 to about 21.7 weight percent of dichlorotrifluoroethane, from about 0.05 to about 0.2 weight percent of nitromethane and from about 0.3 to about 1.5 weight percent ethanol which exhibits a boiling point of 33.0° C. at 760 mm Hg.

The term "azeotrope-like" is also used herein for a composition of HCFC-141b, dichlorotrifluoroethane, nitromethane, and methanol because the composition remains or hangs together in a vapor degreaser.

In another embodiment, the azeotrope-like compositions of the invention comprise from about 60 to about 97 weight percent of HCFC-141b, from about 2.0 to about 35.5 weight percent of dichlorotrifluoroethane, from about 1 to about 4.7 weight percent of methanol and from about 0 01 to about 1.0 weight percent nitromethane.

In a preferred embodiment of the invention, the constant-boiling compositions of the invention comprise from about 70 to about 94 weight percent of HCFC-141b, from about 5 to about 26.0 weight percent of dichlorotrifluoroethane, from about 1.0 to about 4.0 weight percent of methanol and from about 0.02 to about 1.0 weight percent nitromethane.

In a still more preferred embodiment of the invention, the constant-boiling compositions of the invention comprise from about 75 to about 90 weight percent of HCFC-141b, from about 7.5 to about 21.0 weight percent of dichlorotrifluoroethane, from about 2.0 to about 3.8 weight percent of methanol and from about 0.02 to about 0.5 weight percent nitromethane.

In the most preferred embodiment of the invention, the constant-boiling compositions of the invention comprise from about 80.0 to about 90.0 weight percent HCFC-141b, about 7.5 to about 16.0 weight percent dichlorotrifluoroethane, about 0.02 to about 0.2 weight percent nitromethane and about 2.5 to about 3.8 weight percent methanol which exhibits a boiling point of about 30.2° C. at 760 mm Hg.

The azeotrope-like compositions of the invention containing a mixture of HCFC-123 and HCFC-123a behave as an azeotrope-like composition because the separate quaternary azeotropic compositions with HCFC-123 and HCFC-123a have boiling points so close to one another as to be indistinguishable for practical purposes.

The precise or true azeotrope compositions have not been determined but have been ascertained to be within the indicated ranges. Regardless of where the true azeotropes lie, all compositions within the indicated ranges, as well as certain compositions outside the indicated ranges, are azeotrope-like, as defined more particularly below.

It has been found that these azeotrope-like compositions are on the whole nonflammable liquids, i.e. exhibit no flash point when tested by the Tag Open Cup test method—ASTM D 1310-86.

From fundamental principles, the thermodynamic state of a fluid is defined by four variables: pressure, temperature, liquid composition and vapor composition, or P-T-X-Y, respectively. An azeotrope is a unique characteristic of a system of two or more components where X and Y are equal at the stated P and T. In practice, this means that the components of a mixture cannot be separated during distillation, and therefore are useful in vapor phase solvent cleaning as described above.

For the purpose of this discussion, by azeotrope-like composition is intended to mean that the composition behaves like a true azeotrope in terms of its constant boiling characteristics or tendency not to fractionate upon boiling or evaporation. Such composition may or may not be a true azeotrope. Thus, in such compositions, the composition of the vapor formed during boiling or evaporation is identical or substantially identical to the original liquid composition. Hence, during boiling or evaporation, the liquid composition, if it changes at all, changes only to a minimal or negligible extent. This is to be contrasted with non-azeotrope-like compositions in which during boiling or evaporation, the liquid composition changes to a substantial degree.

Thus, one way to determine whether a candidate mixture is "azeotrope like" within the meaning of this invention, is to distill a sample thereof under conditions (i.e., resolution—number of plates) which would be expected to separate the mixture into its separate components. If the mixture is non-azeotropic or non-azeotrope-like, the mixture will fractionate, i.e. separate into its various components with the lowest boiling component distilling off first, and so on. If the mixture is azeotrope-like, some finite amount of a first distillation cut will be obtained which contains all of the mixture components and which is constant boiling or behaves as a single substance. This phenomenon cannot occur if the mixture is not azeotrope-like i.e., it is not part of an azeotropic system. If the degree of fractionation of the candidate mixture is unduly great, then a composition closer to the true azeotrope must be selected to minimize fractionation. Of course, upon distillation of an azeotrope-like composition such as in a vapor degreaser, the true azeotrope will form and tend to concentrate.

It follows from the above that another characteristic of azeotrope-like compositions is that there is a range of compositions containing the same components in varying proportions which are azeotrope-like. All such compositions are intended to be covered by the term azeotrope-like as used herein. As an example, it is well known that at differing pressures, the composition of a given azeotrope will vary at least slightly as does the boiling point of the composition. Thus, an azeotrope of A and B represents a unique type of relationship but with a variable composition depending on temperature and/or pressure. Accordingly, another way of defining azeotrope-like within the meaning of this invention is to state that such mixtures boil within about ±0.8° C. (at about 760 mm Hg) of the boiling point of the most preferred compositions disclosed herein. With HCFC-141b, dichlorotrifluoroethane, ethanol and nitromethane, the preferred mixtures boil within about ±0.4° C. (at about 760 mm Hg) of 33.0° C. As is readily understood by persons skilled in the art, the boiling point of the azeotrope will vary with the pressure.

In the process embodiment of the invention, the azeotrope-like compositions of the invention may be used to clean solid surfaces by treating said surfaces with said compositions in any manner well known to the art such as by dipping or spraying or use of conventional degreasing apparatus.

The HCFC-141b, dichlorotrifluoroethane, nitromethane, methanol and ethanol components of the novel solvent azeotrope-like compositions of the invention are known materials, preferably they should be used in sufficiently high purity so as to avoid the introduction of adverse influences upon the solvency properties or constant boiling properties of the system.

Of the possible six binary combinations of the four components which form the azeotrope-like mixtures of one embodiment of this invention: HCFC-141b, dichlorotrifluoroethane, nitromethane and ethanol, only two are known to form azeotropes: HCFC-141b and ethanol (31.9° C. boiling point at 765 mm Hg), a minimum boiling azeotrope and nitromethane and ethanol (76.0° C. boiling point at 760 mm Hg), a minimum boiling azeotrope. HCFC-141b and HCFC-123, HCFC-141b and nitromethane. HCFC-123 and nitromethane, and HCFC-123 and ethanol, are not known to form binary azeotropes.

Of the possible four ternary combinations of the four components which form the azeotrope-like mixtures of one embodiment of this invention: HCFC-141b, dichlorotrifluoroethane, nitromethane and ethanol, only one is known to form an azeotrope: HCFC-141b, dichlorotrifluoroethane and ethanol (for HCFC-123, 31.6° C. boiling point at 760 mm Hg; for HCFC-123a, 32.0° C. boiling point at 760 mm Hg), a minimum boiling azeotrope. HCFC-141b, dichlorotrifluoroethane and nitromethane; HCFC-141b, nitromethane and ethanol; and dichlorotrifluoroethane, nitromethane and ethanol are not known to form ternary azeotropes.

The advantage of the quaternary systems over the ternary azeotrope, HCFC-141b/ethanol/dichlorotrifluoroethane, is their ability to inhibit corrosion in metals.

Of the possible six binary combinations of the four components which form the constant-boiling mixtures of one embodiment of this invention: HCFC-141b, dichlorotrifluoroethane, nitromethane and methanol, two are known to form azeotropes: HCFC-141b and methanol (29.8° C. boiling point at 765 mm Hg), a minimum boiling azeotrope; and methanol and nitromethane (64.4° C. boiling point at 760 mm Hg), a minimum boiling azeotrope. HCFC-141b and HCFC-123, HCFC-141b and nitromethane, and HCFC-123 and nitromethane are not known to form binary azeotropes.

Of the possible four ternary combinations of the four components which form the constant-boiling mixtures of one embodiment of this invention: HCFC-141b, dichlorotrifluoroethane, nitromethane and methanol, three are known to form azeotropes: HCFC-141b, nitromethane and methanol (29.4° C. boiling point at 760 mm Hg); dichlorotrifluoroethane, nitromethane and methanol (27.2° C. boiling point at 760 mm Hg for HCFC-123 and 30.6° C. boiling point at 760 mm Hg for HCFC-123a); and HCFC-141b, dichlorotrifluoroethane and methanol (for HCFC-123, 29.6° C. boiling point at 760 mm Hg; for HCFC-123a. 29.7° C. boiling point at 760 mm Hg). HCFC-141b, dichlorotrifluoroethane and nitromethane is not known to form ternary azeotropes.

It should be understood that the present compositions may include additional components so as to form new azeotrope-like compositions. Any such compositions are considered to be within the scope of the present invention as long as the compositions are constant-boiling or essentially constant-boiling and contain all of the essential components described herein.

The present invention is more fully illustrated by the following non-limiting Examples.

EXAMPLES 1-2

These examples confirm the existence of azeotrope-like mixtures between 1,1-dichloro-1-fluoroethane, ethanol, dichlorotrifluoroethane and nitromethane via the method of distillation. These examples also illustrate that these mixtures do not fractionate during distillation.

A 5-plate Oldershaw distillation column with a cold water condensed automatic liquid dividing head was used for these examples. For Example 1, the distillation column was charged with approximately 360 grams of 89.9 weight percent HCFC-141b, 8.1 weight percent HCFC-123, 2.0 weight percent ethanol and 0.2 weight percent nitromethane which was heated under total reflux for about an hour to ensure equilibration. A reflux ratio of 2:1 was employed for this particular distillation. Approximately 50 percent of the original charges were collected in four similar-sized overhead fractions. The compositions of these fractions were analyzed using gas chromatography. Table I shows the compositions of the starting materials. The averages of the distillate fractions and the overhead temperatures are quite constant within the uncertainty associated with determining the compositions, indicating that the mixtures are constant boiling or azeotrope-like.

TABLE I

| Example | HCFC-141b | HCFC-123 | ETOH | Nitromethane |
|---|---|---|---|---|
| | Starting Material (WT. %) | | | |
| 1 | 89.9 | 8.1 | 2.0 | 0.2 |
| 2 | 77.6 | 20.2 | 2.0 | 0.2 |
| | Distillate Fractions (WT. %) | | | |
| 1 | 90.3 | 8.3 | 1.3 | 0.05 |
| 2 | 77.2 | 21.7 | 1.0 | 0.08 |

| Example | Boiling Point (°C.) | Barometric Pressure (mm Hg) | Boiling Point (°C.) Corrected to 760 mm Hg |
|---|---|---|---|
| 1 | 32.9 | 743 | 33.3 |
| 2 | 32.3 | 743 | 32.6 |
| | | mean | 33.0 ± 0.4 |

The compositions of the invention are useful as solvents in a variety of vapor degreasing, cold cleaning and solvent cleaning applications including defluxing.

EXAMPLE 3-4

To illustrate the azeotrope-like nature of the mixtures of this invention under conditions of actual use in vapor phase degreasing operation, a vapor phase degreasing machine was charged with a preferred azeotrope-like mixture in accordance with the invention, comprising about 87.0 weight percent HCFC-141$b$, about 9.6 weight percent HCFC-123, about 3.1 weight percent methanol and 0.3 weight percent nitromethane. The mixture was evaluated for its constant boiling or non-segregating characteristics. The vapor phase degreasing machine utilized was a small water-cooled, three-sump vapor phase degreaser, which represents a type of system configuration comparable to machine types in the field today which would present the most rigorous test of solvent segregating behavior. Specifically, the degreaser employed to demonstrate the invention contained two overflowing rinse-sumps and a boil-sump. The boil-sump was electrically heated, and contained a low-level shut-off switch. Solvent vapors in the degreaser were condensed on water-cooled stainless-steel coils. The capacity of the unit was approximately 1.2 gallons. This degreaser was very similar to Baron Blakeslee 2 LLV 3-sump degreasers which are quite commonly used in commercial establishments.

The solvent charge was brought to reflux and the compositions in the rinse sump and the boil sump where the overflow from the work sump was brought to the mixture boiling point, were determined with a perkin Elmer 8500 gas chromatograph. The temperature of the liquid in the boil sump was monitored with a thermocouple temperature sensing device accurate to ±0.2° C. Refluxing was continued for 48 hours and sump compositions were monitored throughout this time. A mixture was considered constant boiling or non-segregating if the maximum concentration difference between sumps for any mixture component was ±2 sigma around the mean value. Sigma is a standard deviation unit and it is our experience from many observations of vapor degreaser performance that commercial "azeotrope-like" vapor phase degreasing solvents exhibit at least a ±2 sigma variation in composition with time and yet produce very satisfactory non-segregating cleaning behavior.

If the mixture were not azeotrope-like, the high boiling components would very quickly concentrate in the boil sump and be depleted in the rinse sump. This did not happen. Also, the concentration of each component in the sumps stayed well within ±2 sigma. These results indicate that the compositions of this invention will not segregate in any types of large-scale commercial vapor degreasers, thereby avoiding potential safety, performance and handling problems. The preferred composition tested was also found to not have a flash point according to recommended procedure ASTM D 1310-86 (Tag Open Cup). The details of the segregation study are shown in Table 2.

Example 3 was repeated for Example 4 except that the composition was a constant-boiling mixture of 70.1 weight percent HCFC-141$b$, 26.8 weight percent HCFC-123, 0.2 weight percent nitromethane and 2.9 weight percent methanol. The results are shown in Table 2 below.

TABLE 2

| | | 48 Hours | |
|---|---|---|---|
| | Initial Composition | Condensate Sump | Boil Sump |
| Example 3 | | | |
| R-141b | 87.0 | 86.5 | 86.4 |
| R-123 | 9.6 | 9.7 | 10.0 |
| MeOH | 3.1 | 3.6 | 2.6 |
| NM | 0.3 | 0.2 | 1.0 |
| Temp | | 25.9° C. | 29.7° C. |
| Prs | | 739 mm Hg. | 739 mm Hg. |
| Example 4 | | | |
| R-141b | 70.1 | 70.1 | 70.1 |
| R-123 | 26.8 | 27.0 | 25.5 |
| MeOH | 2.9 | 2.8 | 3.1 |
| NM | 0.2 | 0.06 | 0.8 |
| Temp | | 27.0° C. | 29.8° C. |
| Prs | | 739 mm Hg. | 739 mm Hg. |

Having described the invention in detail and by reference to preferred embodiments thereof, it will be apparent that modifications and variations are possible without departing from the scope of the invention defined in the appended claims.

What is claimed is:

1. Azeotrope-like compositions consisting essentially of from about 62.5 to about 97.9 weight percent 1,1-dichloro-1-fluoroethane, from about 2.0 to about 35.5 weight percent dichlorotrifluoroethane selected from the group consisting of 1,1-dichloro-2,2,2-trifluoroethane, 1,2-dichloro-1,2,2-trifluoroethane, and mixtures thereof, from about 0.02 to about 0.3 weight percent nitromethane, and from about 0.1 to about 3.0 weight percent ethanol wherein said azeotrope-like components consist of said 1,1-dichloro-1-fluoroethane, said dichlorotrifluoroethane, said nitromethane, and said ethanol and said azeotrope-like compositions boil at about 33.0° C. at 760 mm Hg.

2. The azeotrope-like compositions according to claim 1 wherein said dichlorotrifluoroethane is 1,2-dichloro-1,2,2-trifluoroethane.

3. The azeotrope-like compositions according to claim 1 wherein said dichlorotrifluoroethane is 1,1-dichloro-2,2,2-trifluoroethane.

4. The azeotrope-like compositions according to claim 1 consisting essentially of from about 72.0 to about 94.7 weight percent said 1,1-dichloro-1-fluoroethane, from about 3.0 to about 26.0 weight percent said dichlorotrifluoroethane, from about 0.05 to about 0.3 weight percent said nitromethane and from about 0.3 to about 2.0 weight percent said ethanol.

5. The azeotrope-like compositions according to claim 1 consisting essentially of from about 75.0 to about 90.0 weight percent said 1,1-dichloro-1-fluoroethane, from about 5.0 to about 24.7 weight percent said dichlorotrifluoroethane, from about 0.05 to about 0.2 weight percent said nitromethane and from about 0.3 to about 1.8 weight percent said ethanol.

6. The azeotrope-like compositions according to claim 1 consisting essentially of about 77.2 to about 90.0 weight percent said 1,1-dichloro-1-fluoroethane, about 5.0 to about 21.7 weight percent said dichlorotrifluoroethane, from about 0.05 to about 0.2 weight percent said nitromethane and about 0.3 to about 1.5 weight percent said ethanol.

7. The azeotrope-like compositions according to claim 6 wherein said dichlorotrifluoroethane is 1,2-dichloro-1,2,2-trifluoroethane.

8. The azeotrope-like compositions according to claim 6 wherein said dichlorotrifluoroethane is 1,1-dichloro-2,2,2-trifluoroethane.

9. The Azeotrope-like compositions of claim 1 which boil at 33.0° C.±4° C. at 760 mm Hg.

10. Azeotrope-like compositions consisting essentially of about 60 to about 97 weight percent 1,1-dichloro-1-fluoroethane, about 2 to about 35.5 weight percent dichlorotrifluoroethane selected from the group consisting of 1,1-dichloro-2,2,2-trifluoroethane, 1,2-dichloro-1,2,2-trifluoroethane, and mixtures thereof, about 0.01 to about 1.0 weight percent nitromethane, and about 1 to about 4.7 weight percent methanol wherein said azeotrope-like components consist of said 1,1-dichloro-1-fluorethane, said dichlorotrifluoroethane, said nitromethane, and said methanol and said azeotrope-like compositions boil at about 30.2° C. at 760 mm Hg.

11. The compositions of claim 10 wherein said dichlorotrifluoroethane is 1,2-dichloro-1,2,2-trifluoroethane.

12. The compositions of claim 10 wherein said dichlorotrifluoroethane is 1,1-dichloro-2,2,2-trifluoroethane.

13. The compositions of claim 10 wherein said compositions consist essentially of about 70 to about 94 weight percent said 1,1-dichloro-1-fluoroethane, about 5 to about 26 weight percent said dichlorotrifluoroethane, about 0.02 to about 1 weight percent said nitromethane and about 1 to about 4 weight percent said methanol.

14. The compositions of claim 10 wherein said compositions consist essentially of about 75 to about 90 weight percent said 1,1-dichloro-1-fluoroethane, about 7.5 to about 21 weight percent said dichlorotrifluoroethane, about 0.02 to about 0.5 weight percent said nitromethane and about 2 to about 3.8 weight percent said methanol.

15. The compositions of claim 10 wherein said compositions consist essentially of about 80 to about 90 weight percent said 1,1-dichloro-1-fluoroethane, about 7.5 to about 16.0 weight percent said dichlorotrifluoroethane, about 0.02 to about 0.2 weight percent said nitromethane and about 2.5 to about 3.8 weight percent said methanol.

16. The compositions of claim 15 wherein said dichlorotrifluoroethane is 1,2-dichloro-1,2,2-trifluoroethane.

17. The compositions of claim 15 wherein said dichlorotrifluoroethane is 1,1-dichloro-2,2,2-trifluoroethane.

18. A method of cleaning a solid surface which comprises treating said surface with said azeotrope-like composition as defined in claim 1.

19. A method of cleaning a solid surface which comprises treating said surface with said azeotrope-like composition as defined in claim 4.

20. A method of cleaning a solid surface which comprises treating said surface with said azeotrope-like composition as defined in claim 10.

* * * * *